US008022481B2

(12) United States Patent
Nanda et al.

(10) Patent No.: US 8,022,481 B2
(45) Date of Patent: Sep. 20, 2011

(54) ROBUST SHALLOW TRENCH ISOLATION STRUCTURES AND A METHOD FOR FORMING SHALLOW TRENCH ISOLATION STRUCTURES

(75) Inventors: Arun K. Nanda, Orlando, FL (US); Nace Rossi, Singapore (SG); Ranbir Singh, Singapore (SG)

(73) Assignee: Agere Systems Inc., Allentown, PA (US)

( * ) Notice: Subject to any disclaimer, the term of this patent is extended or adjusted under 35 U.S.C. 154(b) by 98 days.

(21) Appl. No.: 12/356,600

(22) Filed: Jan. 21, 2009

(65) Prior Publication Data

US 2009/0127651 A1 May 21, 2009

Related U.S. Application Data

(62) Division of application No. 11/321,206, filed on Dec. 29, 2005, now Pat. No. 7,514,336.

(51) Int. Cl.
*H01L 29/76* (2006.01)
*H01L 29/94* (2006.01)

(52) U.S. Cl. ........ 257/374; 257/506; 257/510; 438/425; 438/434

(58) Field of Classification Search .................. 257/374, 257/506, 510, E21.546, E29.02; 438/425, 438/434
See application file for complete search history.

(56) References Cited

U.S. PATENT DOCUMENTS

| | | | |
|---|---|---|---|
| 6,187,651 B1 | 2/2001 | Oh | |
| 6,255,194 B1 * | 7/2001 | Hong | 438/435 |
| 6,319,794 B1 | 11/2001 | Akatsu et al. | |
| 6,921,947 B2 * | 7/2005 | Furuta et al. | 257/368 |
| 2001/0015046 A1 | 8/2001 | Hong | |
| 2002/0123206 A1 | 9/2002 | Hong et al. | |
| 2003/0203596 A1 | 10/2003 | Ho et al. | |
| 2004/0198019 A1 | 10/2004 | Yasuii et al. | |
| 2004/0214405 A1 | 10/2004 | Ahn et al. | |
| 2007/0152294 A1 | 7/2007 | Nanda et al. | |

FOREIGN PATENT DOCUMENTS

| | | |
|---|---|---|
| EP | 0954022 A1 | 11/1999 |
| GB | 2368460 A | 5/2002 |
| WO | 9836452 A1 | 8/1998 |
| WO | 9944223 A2 | 9/1999 |

* cited by examiner

*Primary Examiner* — Theresa T Doan

(57) ABSTRACT

In a semiconductor substrate, a shallow trench isolation structure having a dielectric material disposed in voids of a trench-fill material and a method for forming the shallow trench isolation structure. The voids may be formed during a wet clean process after the dielectric material is formed in the trench. A conformal silicon nitride layer is formed over the substrate and in the voids. After removal of the silicon nitride layer, the voids are at least partially filled by the silicon nitride material.

5 Claims, 4 Drawing Sheets

ROBUST SHALLOW TRENCH ISOLATION STRUCTURES AND A METHOD FOR FORMING SHALLOW TRENCH ISOLATION STRUCTURES

CROSS REFERENCE TO RELATED APPLICATION

This Application is a Divisional of U.S. application Ser. No. 11/321,206 filed on Dec. 29, 2005, to Arun K. Nanda, entitled "ROBUST SHALLOW TRENCH ISOLATION STRUCTURES AND A METHOD FOR FORMING SHALLOW TRENCH ISOLATION STRUCTURES," now U.S. Pat. No. 7,514,336; commonly assigned with the present invention and incorporated herein by reference.

FIELD OF THE INVENTION

The present invention relates generally to integrated circuits and more particularly to a method for forming a shallow trench isolation (STI) structure within an integrated circuit and to a shallow trench isolation structure formed according to the method.

BACKGROUND OF THE INVENTION

Integrated circuits typically comprise a semiconductor substrate and semiconductor devices, such as transistors, comprising doped regions within the substrate. Interconnect structures overlie the semiconductor substrate for electrically connecting the doped regions to form electrical devices and circuits. Conventional interconnect structures comprise dielectric layers alternating with conductive layers. Substantially vertical conductive vias or plugs in the dielectric layers connect substantially horizontal conductive traces or runners in the conductive layers.

A CMOS device (complimentary metal-oxide semiconductor field effect transistor) comprises an n-channel and a p-channel metal-oxide semiconductor field effect transistor (MOSFET) formed in oppositely-doped adjacent wells. Each MOSFET further comprises source and drain regions separated by a channel, a gate oxide formed over the channel and a doped polysilicon gate electrode formed over the gate oxide. An appropriate gate voltage inverts the channel to permit current flow between the source and the drain regions.

Within an integrated circuit substrate, it may be necessary to electrically isolate certain doped regions to avoid the effects of parasitic devices that are formed by the undesired interaction of doped regions. For example, a parasitic bipolar structure, e.g., a p-n-p-n thyristor, is formed by the wells and the doped source/drain regions of a CMOS device. The thyristor is inoperative (off) under normal CMOS operating conditions. However, under certain bias conditions the p-n-p regions supply base current to the n-p-n regions, causing leakage current flow between the two MOSFETS of the CMOS device that can cause latch-up of the CMOS device. Isolation structures are conventionally formed within the substrate between adjacent MOSFETS to prevent this leakage current.

An oxide (silicon dioxide) isolation region, formed according to a local oxidation of silicon (LOCOS) process or according to a shallow trench isolation (STI) process, electrically isolates doped regions of adjacent transistors (or other devices formed in the integrated circuit) to minimize leakage current and reduce the aforementioned parasitic effects.

The local oxidation of silicon process forms recessed LOCOS isolation regions in non-active areas (field regions) of the semiconductor substrate. According to one LOCOS process, a layer of silicon nitride is deposited over the substrate and patterned according to conventional masking and etching steps to form openings in the silicon nitride that expose underlying semiconductor substrate regions. The isolating LOCOS regions are formed by oxidizing the exposed semiconductor substrate through the openings. No oxidation occurs in the regions masked by the silicon nitride.

An STI structure comprises a dielectric-filled substrate trench (about 300 nm deep) for electrically isolating active devices. Shallow trench isolation structures enjoy certain advantages over LOCOS structures as the STI structures consume less substrate surface area and exhibit a flatter upper surface topography. The reduced area consumption permits the circuit designer to include more transistors per unit area in the integrated circuit. The flatter upper surface topography is beneficial for forming properly dimensioned overlying material layers and for accurate photolithographic patterning.

STI structures, which are especially useful for device sizes below about 0.25 microns, also provide superior isolation because sharp corners formed at the bottom of the STI trench create voltage barriers that tend to block leakage currents between adjacent doped regions. LOCOS regions generally present rounded corners and thus may permit some leakage current.

FIGS. 5-8 are cross-sectional views across a common plane (not drawn to scale) illustrating successive prior art processing steps for forming a shallow trench isolation structure in a substrate of one integrated circuit of a plurality of integrated circuits formed on a wafer.

A semiconductor substrate 30 in FIG. 5 comprises spaced-apart doped regions 32. It is desired to isolate the doped regions 32 with a shallow trench isolation structure therebetween. A stress-reducing silicon dioxide layer 36 (also referred to as a pad oxide layer 36) is deposited or grown over an upper surface 37 of the substrate 30. Next, a silicon nitride layer 38 is deposited (typically according to a low pressure chemical vapor deposition process) over the silicon dioxide layer 36.

A photoresist layer 40 is deposited, exposed and developed according to known processes to form an opening 41 therein.

An opening 46 with sidewalls 47 is formed in the silicon nitride layer 38 and the pad oxide layer 36 through the opening 41. The opening 46 is preferably formed using a plasma etching process employing oxygen and a fluorine-containing gas, such as C2F6 and/or CHF3 (the fluorine-containing gas is selective to the silicon substrate 30).

The photoresist layer 40 is removed and the wafer is cleaned. Using the opening 46 as a mask, a trench 48 (see FIG. 6) with sidewalls 49 is formed in the semiconductor substrate 30 during an etching step, conventionally comprising a plasma dry etch using hydrogen bromide and chlorine.

A dielectric liner film 50 is formed or deposited in the trench 48.

As illustrated in FIG. 7, an STI structure 55 is formed by depositing dielectric material in the trench 48. The material deposition comprises a first step wherein a relatively low density dielectric material 56A is deposited within the trench 48 substantially adjacent the liner film 50. During a second deposition (bulk deposition) step, sufficient power is supplied to the deposition chamber to form a high ion density, which increases the material deposition rate (and the process throughput) to form a high-density dielectric material 56B (e.g., undoped silicate glass) in the trench 48. Typically the latter deposition is performed according to a high-density plasma undoped silicate glass deposition process (HDP USG). In another embodiment an atmospheric chemical vapor deposition process (APCVD) can be used in lieu of the HDP USG process. To deposit the high-density HDP USG material 56B, a plasma ion density in a range of about $10^{11}$ to about $10^{13}$ ions/cm$^3$ is created within the deposition chamber, causing a relatively high material deposition rate and formation of the high-density material.

During the deposition step, dielectric material is also deposited on an upper surface 59 of the silicon nitride layer 38. A chemical-mechanical polishing (CMP) step removes the dielectric material from the upper surface 59, stopping on the silicon nitride layer 38. Since the CMP polishing rate for the dielectric material (e.g., HDP USC) is greater than the CMP polishing rate for silicon nitride, an upper surface 60 of the STI structure 55 is recessed below the upper surface 59 of the silicon nitride layer 38.

To complete formation of the STI structure 55, the wafer is cleaned according to a hydrofluoric (HF) clean process, the silicon nitride layer 38 and the pad oxide layer 36 are removed using known processes, such as an HF wet etch, and finally the wafer is cleaned again. FIG. 8 illustrates the structural elements of the STI structure 55, including sidewalls 62, following completion of these processing steps. For convenience, the low-density dielectric material 56A and the high-density dielectric material 56B are not separately depicted.

During the wet etch process to remove the silicon nitride layer 38 and the pad oxide layer 36, voids 70 (see FIG. 8) form at an interface between the low-density dielectric material and the high-density dielectric material.

During later deposition of a gate polysilicon layer, undesired polysilicon stringers (referred to as "wrap-ups") can form around the sidewalls 62 and in the voids 70. The stringers may create short circuits or leakage current paths that defeat the STI isolation function, degrading performance of the integrated circuit, resulting in reliability issues and device failures. A process scheme that prevents void formation at the interface is desired.

In an effort to reduce a width and a depth of the voids 70 (and thus the likelihood that polysilicon stringers will form), it is known to shorten a duration of the cleaning step (typically a hydrofluoric acid clean) that follows the wet etch process for removing the silicon nitride layer 38 and the pad oxide layer 36. However, it is also known that a shorter clean may cause nitride residues and contaminants to remain on the substrate 30, possibly causing undesirable short circuits or leakage currents within the STI structure 55 and the substrate 30.

BRIEF SUMMARY OF THE INVENTION

According to one embodiment, the present invention comprises a method for forming a shallow trench isolation structure in an integrated circuit. The method comprises providing a semiconductor layer, forming an opening in the semiconductor layer, depositing a dielectric material in the opening, depositing a conformal material overlying the dielectric material and removing the conformal material, whereby voids that may be formed in the dielectric material are at least partially filled by the conformal material after the step of removing the conformal material.

According to another embodiment of the invention, an integrated circuit structure, comprises a semiconductor layer, a device isolation structure formed in the semiconductor layer, the device isolation structure comprising a first dielectric material disposed within a trench in the semiconductor layer, wherein voids may be present in the first dielectric material proximate sidewalls of the trench and a second dielectric material within the voids.

BRIEF DESCRIPTION OF THE DRAWINGS

The present invention can be more easily understood and the advantages and uses thereof more readily apparent when the following detailed description of the present invention is read in conjunction with the figures wherein.

In accordance with common practice, the various described device features are not drawn to scale, but are drawn to emphasize specific features relevant to the invention. Like reference characters denote like elements throughout the figures and text.

DETAILED DESCRIPTION OF THE INVENTION

Before describing in detail the particular methods and structures related to formation of STI structures according to the present invention, it should be observed that the present invention resides primarily in a novel and non-obvious combination of elements and process steps. So as not to obscure the disclosure with details that will be readily apparent to those skilled in the art, certain conventional elements and steps have been presented with lesser detail, while the drawings and specification describe in greater detail other elements and steps pertinent to understanding the invention.

The following embodiments are not intended to define limits as to the structure or method of the invention, but only to provide exemplary constructions. The embodiments are permissive rather than mandatory and illustrative rather than exhaustive.

The present invention comprises a method for forming an STI structure that avoids the deleterious effects of the voids 70 associated with the prior art processes described above.

Figure 1:
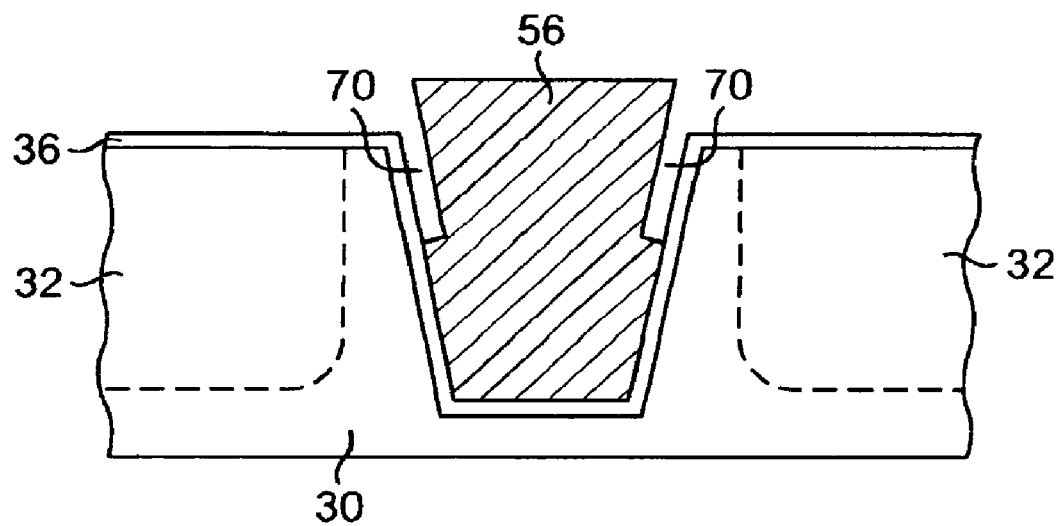
FIGS. 1-4 are cross-sectional views of a substrate during successive processing step to form a shallow trench isolation structure according to the teachings of the present invention.

FIG. 1 depicts the STI structure 55 after removal of the silicon nitride layer 38. According to the teachings of the present invention, the pad oxide layer 36 remains overlying the substrate 30.

Figure 2:
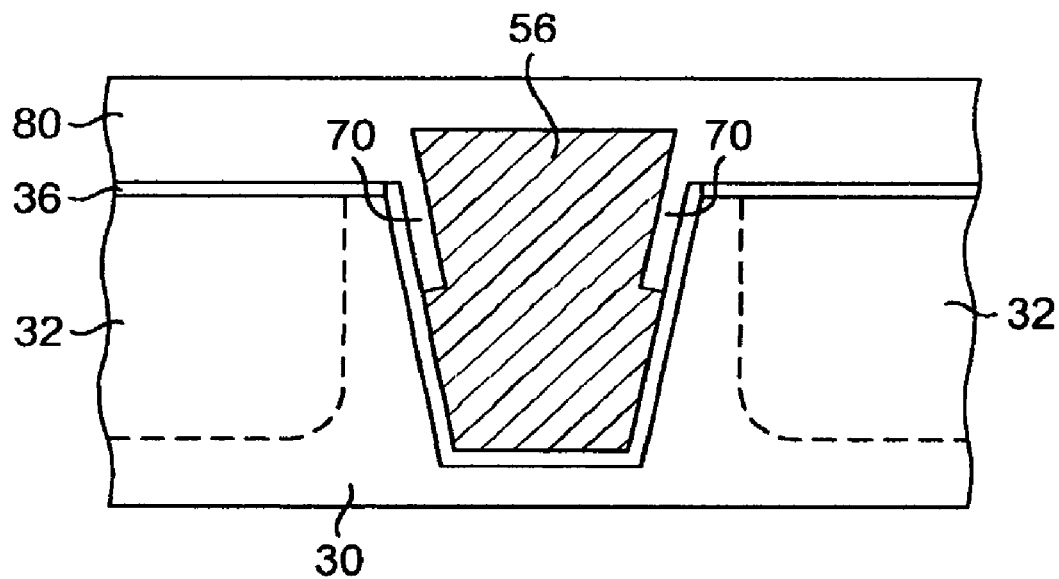
Figure 3:
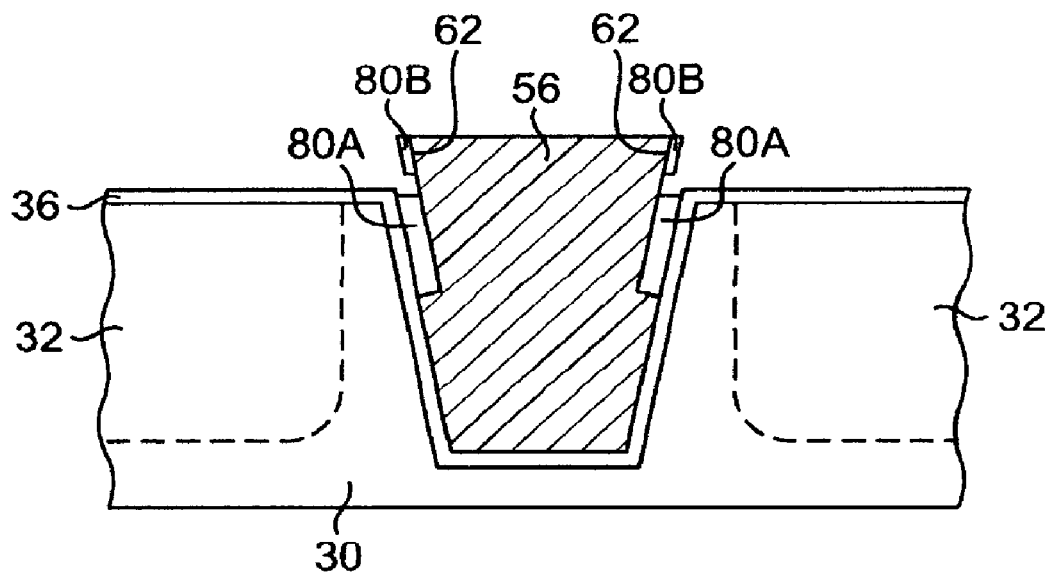

According to the present invention, a conformal silicon nitride layer 80 (between about 50 nm and 100 nm thick) is deposited overlying the pad oxide layer 36 and fills the voids 70 with silicon nitride regions 80A. See FIG. 2. According to one embodiment, the silicon nitride layer 80 is deposited using an LPCVD process that produces a conformal material layer for filling the voids 70. Other processes that produce a conformal dielectric material layer (e.g., silicon oxynitride) can be used in lieu of the LPCVD process to fill the voids 70. For example, an appropriately controlled PECVD process can be used to deposit a conformal layer of silicon nitride. A conformal silicon carbide layer (typically deposited according to a chemical vapor deposition process) can also be used to fill the voids 70.

The silicon nitride layer 80 is etched using a conventional blanket nitride etch back process with end point control that is terminated upon reaching the pad oxide layer 36 and the dielectric material 56 in the trench. See FIG. 2. The silicon nitride regions 80A remain in the voids 70 as shown, at least partially filling the voids 70.

In one embodiment, the nitride etch comprises a two step process. During the first step a mixture of oxygen and a fluorine-containing gas (e.g., C2F6 or CF4) are supplied to the plasma etch chamber at respective flow rates of about 5 SCCM and about 100 SCCM. A chamber pressure is about 100 mTorr and a power supplied to the chamber is about 450 W. As is known by those skilled in the art, the flow rates, pressure and power can be varied from the specific values given by at least 10% without jeopardizing the etch results.

Next an over etch process selective to the underlying semiconductor substrate 30 is performed using a mixture of a polymerized gas (e.g., CHF3 at about 10 SCCM), to provide the desired selectivity, argon (at about 20 SCCM) and the fluorine-containing gas (at about 10 SCCM). A chamber pressure is about 100 mTorr and a power supplied to the chamber is about 300 W. The flow rates, pressure and power can be varied from the specific values given by at least 10%. Those skilled in the art recognize that other etch processes can be employed to etch the silicon nitride layer 80.

Figure 4:
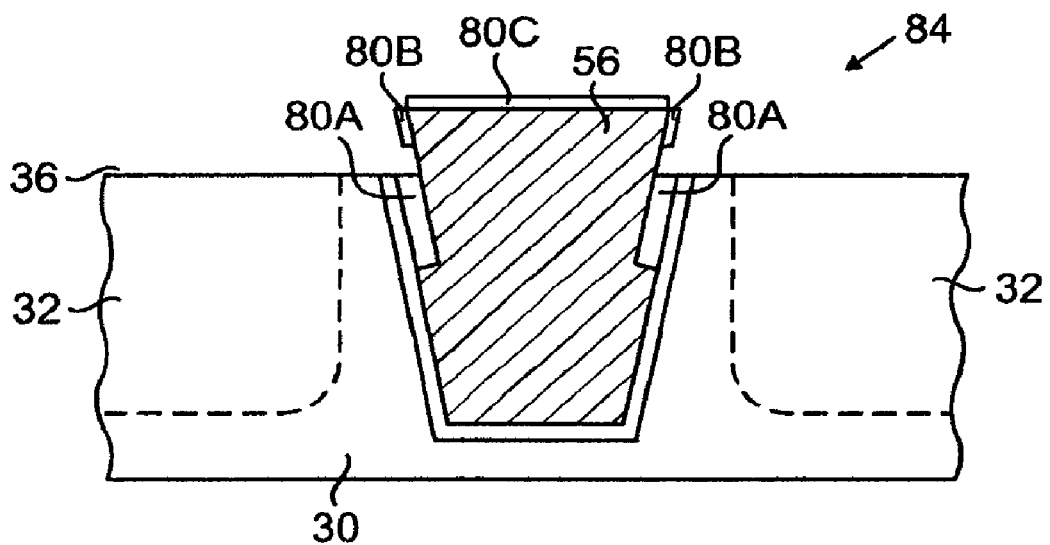
Figure 5:
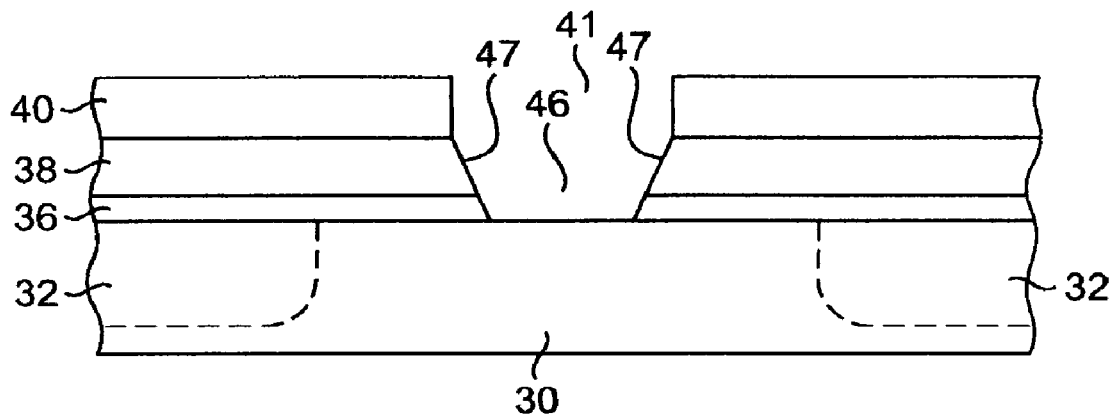
FIGS. 5-8 are cross-sectional views of a substrate during successive processing steps to form a prior art shallow trench isolation structure.
Figure 6:
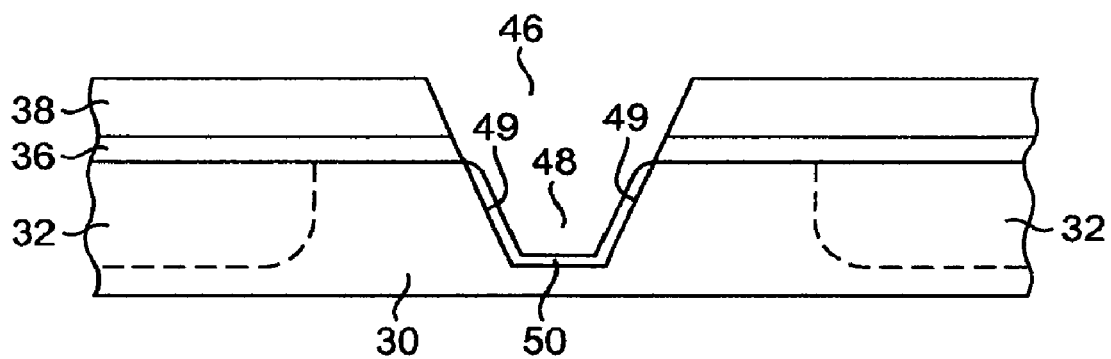

The pad oxide is removed using known processes, such as an HF wet etch, and the wafer is cleaned (e.g., using an RCA clean process). A final STI structure 84 is illustrated in FIG. 4.

Given its conformal properties, the silicon nitride film 80 not only fills the voids 70, but after etch back silicon nitride regions 80B remain on the sidewalls 62 of the STI structure 84, protecting the sidewalls 62 from chipping or deteriorating during subsequent processing.

Figure 7:
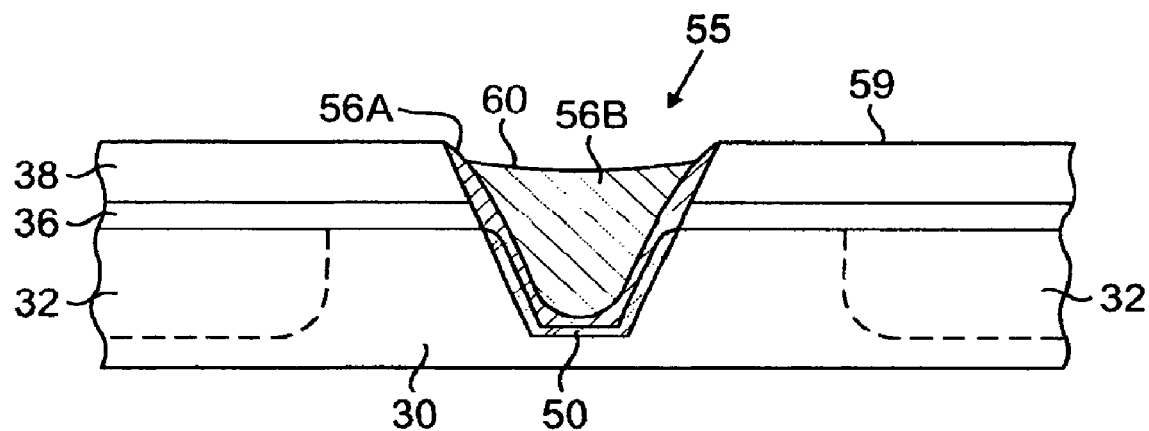
Figure 8:
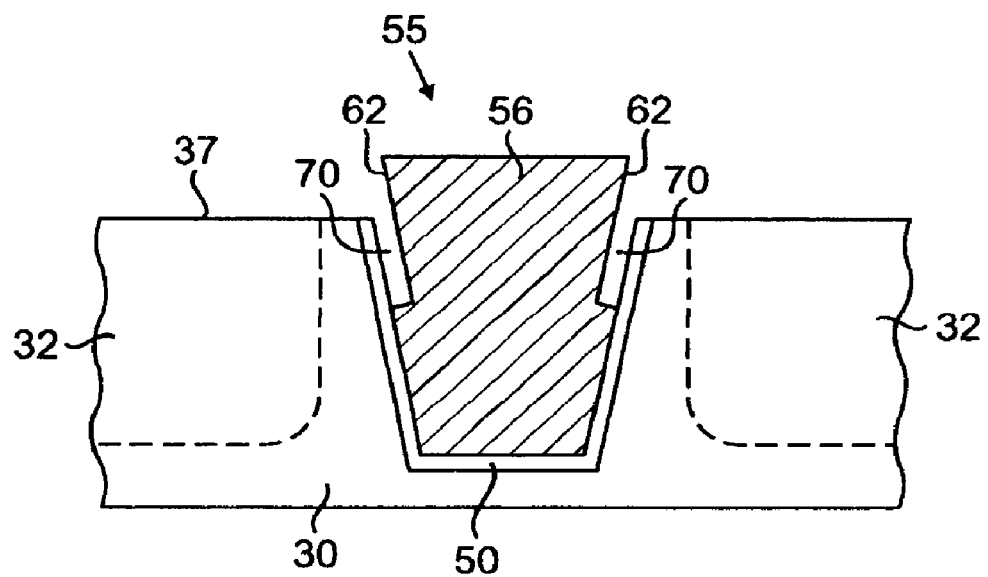

It is known that wide STI structures are susceptible to dishing during the CMP process for removing silicon dioxide from the upper surface 59. An exaggerated dishing effect is illustrated in FIG. 7. A remnant 80C of the conformal silicon nitride layer 80 covers the dished area to present a flatter STI upper surface that is beneficial during photolithography and deposition of subsequent material layers. See FIG. 4.

The robust approach of the present invention obviates the effects of conventional fabrication processes that lead to formation of voids in the STI structure and random process variations (such as etch rates) that may cause the formation of relatively large problematic voids. The present invention fabricates an STI structure without voids according to a repeatable and consistent process. The probability of polysilicon stringer formation is substantially reduced, device reliability is substantially improved and device failure rate is substantially lowered.

An architecture and process have been described as useful for forming STI structure in a semiconductor substrate. Specific applications and exemplary embodiments of the invention have been illustrated and discussed, which provide a basis for practicing the invention in a variety of ways and in a variety of circuit structures. Numerous variations are possible within the scope of the invention. Features and elements associated with one or more of the described embodiments are not to be construed as required elements for all embodiments. The invention is limited only by the claims that follow.

What is claimed is:

1. An integrated circuit structure, comprising:
a semiconductor layer;
a device isolation structure formed in the semiconductor layer, the device isolation structure comprising a first dielectric material disposed within a trench in the semiconductor layer, wherein voids are present in the first dielectric material proximate sidewalls of the trench; and
a first remnant segment of a second dielectric material located within the voids and a second remnant segment of the second dielectric material located on at least one side of the device isolation structure that extends above the semiconductor layer, wherein the first remnant segment and the second remnant segment are spaced apart.

2. The semiconductor device of claim 1 wherein the second dielectric material comprises silicon nitride, silicon oxynitride or silicon carbide.

3. The semiconductor device of claim 1 wherein an upper region of the first dielectric material comprises an upper surface, and wherein the second dielectric material is disposed on the upper surface.

4. The semiconductor device of claim 1 further including a material layer located over the first and second remnant segments and the device isolation structure.

5. The semiconductor device of claim 1 wherein the second remnant segment is located on the top side of the device isolation structure.

* * * * *